United States Patent

Murase et al.

Patent Number: 5,828,595
Date of Patent: Oct. 27, 1998

[54] OPTICAL RECORDING AND PLAYBACK APPARATUS AND METHOD USING SINGLE LIGHT ABSORBENTS

[75] Inventors: Norio Murase, Ikeda; Tetsuo Yazawa, Toyono, both of Japan

[73] Assignee: Director General, Agency of Industrial Science and Technology, Tokyo, Japan

[21] Appl. No.: 729,301

[22] Filed: Oct. 10, 1996

[30] Foreign Application Priority Data

Oct. 13, 1995 [JP] Japan ................................ 7-292050

[51] Int. Cl.$^6$ ............................................. G11C 13/00
[52] U.S. Cl. ..................... 365/127; 365/124; 365/215
[58] Field of Search .............................. 365/127, 124, 365/112, 110, 215

[56] References Cited

U.S. PATENT DOCUMENTS

| | | | |
|---|---|---|---|
| 4,101,976 | 7/1978 | Castro et al. | 365/119 |
| 4,103,346 | 7/1978 | Haarer et al. | 365/216 |
| 4,757,472 | 7/1988 | Magee et al. | 365/120 |
| 4,956,813 | 9/1990 | Seya et al. | 365/127 |
| 5,107,483 | 4/1992 | Nakajima et al. | 369/108 |
| 5,184,323 | 2/1993 | Schildkraut et al. | 365/124 |
| 5,272,667 | 12/1993 | Yamada et al. | 365/113 |

FOREIGN PATENT DOCUMENTS

| | | |
|---|---|---|
| 0 292 240 | 11/1988 | European Pat. Off. . |
| 0 509 450 | 10/1992 | European Pat. Off. . |
| 1-152452 | 6/1989 | Japan . |

*Primary Examiner*—Huan Hoang
*Attorney, Agent, or Firm*—Nikaido, Marmelstein, Murray & Oram LLP

[57] ABSTRACT

In a system (apparatus and method) which employs a light absorbent material surrounded by an optically transparent matrix as a recording medium and in which the presence or absence of emission light of a specific wavelength from unity of the light absorbent material is used for optical writing and reading, the light emitted in response to reading light is condensed and spectrally diffracted and the light intensity is detected for each specific wavelength and related to recorded information.

16 Claims, 3 Drawing Sheets

OPTICAL RECORDING AND PLAYBACK APPARATUS AND METHOD USING SINGLE LIGHT ABSORBENTS

FIELD OF THE INVENTION

The present invention relates to a high-density information recording method and associated apparatus and more particularly to a spectral multiple recording method and associated apparatus.

DESCRIPTION OF THE PRIOR ART

In the conventional optical recording system in which one bit of information is stored in one location of a recording medium, the recording density that can be obtained is dictated by the diameter of the light spot used for information recording and playback. The light spot diameter in use in the current optical recording system has been reduced to the minimum determined by the light diffraction limit and it is, therefore, generally considered difficult. to further increase the information recording density in any substantial measure.

Under the circumstances U.S. Pat. No. 4,101,976 issued to Castro et al (Jul. 18, 1978) suggested the possibility of realizing a phenomenal increase in information recording density by carrying out spectral recording utilizing the so-called hole burning phenomenon. The term hole burning phenomenon means a sharp dip (hole) which takes place in the absorption of light of a specific wavelength within the absorption spectrum. This phenomenon occurs when a specific light absorbent material molecularly dispersed and surrounded by an optically transparent matrix is irradiated with light of a specific wavelength within the absorption spectrum to thereby selectively cause the light absorbents which absorb light of that wavelength to be reactive to and absorptive of light of a different wavelength.

When this phenomenon is utilized, the recording medium is enabled to memorize the wavelength of exposure light in the form of a hole, with the result that by relating the presence or absence of a hole at a specific wavelength to a data bit of 0 or 1, a multiplicity of data can be stored in one location of the recording medium (spectral multiple recording). In this connection, the number of data that are recorded in one location is referred to as multiplicity. At cryogenic temperatures near the boiling point (ca 4 K) of liquid helium, this multiplicity can be as many as about 1000 so that this system is expected to be a future ultrahigh density memory.

However, the inventors indicated in inter alia Journal of Optical Society of America B/vol. 9, 998–1005 (1992) that in order to achieve a sufficiently high recording density by the conventional hole burning technology, it is necessary that the number of single light absorbents per light spot be not less than about $10^7$ and that about $10^4$ single light absorbents (atoms, molecules, or ions) be allocated per bit of information. To meet these requirements, it is necessary to satisfy stringent conditions as to the concentration of dispersed single light absorbents as well as the absorption cross section. However, no suitable material has been discovered and, therefore, it has been difficult to achieve a high information recording density while meeting the requirement of providing a signal with a satisfactory S/N ratio in a predetermined time period.

FIG. 1 is a schematic diagram showing the hitherto-known spectral hole-burning recording technology. The recording medium is an artifact comprising a molecular dispersion of a light absorbent material in an optically transparent matrix. All the single light absorbents are identical but because of a slight variation in the effect of the surrounding matrix, they vary slightly in absorption wavelength position and consequently an absorption band having a certain width as a whole is formed. In order that this absorption band may be smoothened as a whole, it is necessary that about $10^7$ single light absorbents exist in one light spot.

Upon exposure to a high-intensity light beam with a given wavelength $\lambda n$ within this absorption band, only the absorbents that absorb the light undergoes photochemical reactions to become absorptive of light of a different wavelength, with the result that sharp holes are formed in the absorption band. This is the hole burning event. By varying the wavelength of laser light with its irradiating position held stationary, a multiplicity of data can be recorded in one location of a recording medium through exploitation of the above phenomenon. However, in order to realize ultrahigh-density information recording in this system, it was found necessary to critically control the concentration of the light absorbent material dispersed and the absorption cross-section, among other conditions.

Recently it has been demonstrated that a signal from one molecule of light absorbent material can be successfully extracted by reducing the concentration of the light absorbent material dispersed in a matrix to an extremely low level in the conventional hole-burning material. Thus, as shown in Nature, 355, 335–337 (Jan. 23, 1992), a suggestion was made for applying this method to ultrahigh-density recording but no detailed study has been done on the technique for extracting necessary signals at a sufficiently high speed.

SUMMARY OF THE INVENTION

It is a primary object of the present invention to provide an optical writing and reading technology for implementing an ultrahigh-density recording system, with the practical need to obtain signals with a good S/N ratio at a high speed being fulfilled. After intensive research, the inventor of the present invention found that the above object can be accomplished by adopting a novel method for reading information signals from a recording medium. The present invention, therefore, is directed to the following optical writing and reading apparatus and optical writing and reading method using said apparatus.

An optical recording and playback apparatus wherein the presence or absence of light of a specific wavelength in the emission from unity of a light absorbent material in a system using single light absorbents surrounded by an optically transparent matrix, which comprises a means for condensing the emitted light and a means for spectrally diffracting the condensed light, detecting the light intensity by wavelength, and relating it to a data bit.

An optical recording and playback method wherein the presence or absence of light of a specific wavelength in the emission light from unity of a light absorbent material in a system using light absorbents surrounded by an optically transparent matrix, which comprises condensing the light emitted in accordance with reading light, spectrally diffracting the condensed light, detecting the light intensity by wavelength, and relating it to a data bit.

DETAILED DESCRIPTION OF THE INVENTION

Figure 1C:
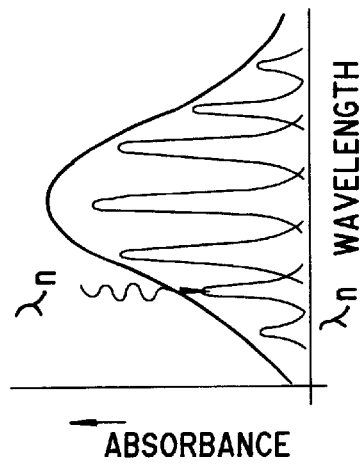
FIG. 1 is a schematic diagram illustrating a spectral multiple recording system utilizing the known hole burning phenomenon.
Figure 1D:
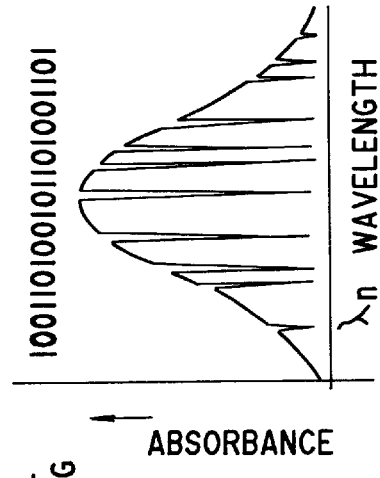
Figure 1B:
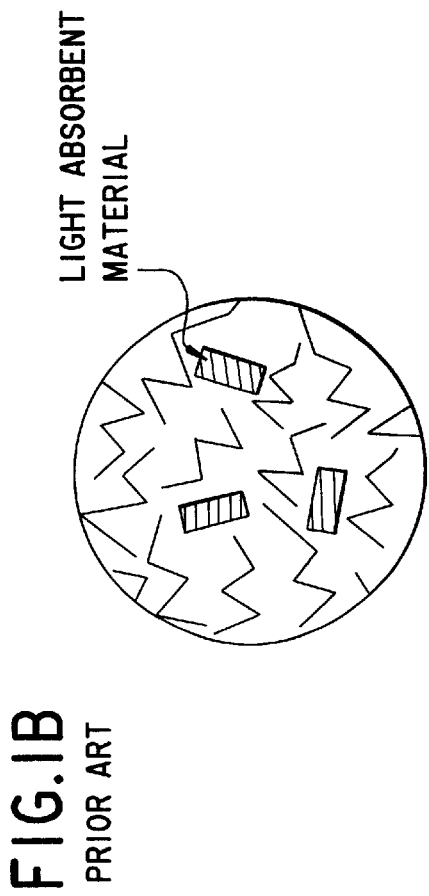
Figure 1A:
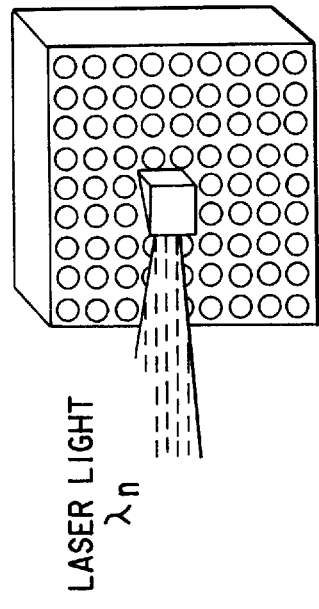

Condensing and spectral diffraction of emitted light

In the present invention, the fluorescent emission light from light absorbents is condensed and the condensed light is spectrally diffracted for reading. In a preferred embodiment, a reflective layer formed on a paraboloid or a plane is used as a light-condensing means. By this means, the signal from a single light absorbent can be condensed with high efficiency. Thus, the emission light can be efficiently condensed by disposing a reflective paraboloid or plane in the vicinity of the recording medium.

Furthermore, by disposing a transparent layer with a refractive index differing from that of the recording medium in the vicinity of the medium, the light can be multiple-reflected to enhance the readout signal efficiently. This transparent film plays the role of protecting the recording medium from mechanical stimulation and fouling as well. An ultraviolet-cured resin film can be mentioned as an example of such transparent protective layer. This protective layer can be formed typically by spin-coating a substrate with UV-curing resin.

The present invention involves a means for pro ejecting light with a broad wavelength bandwidth to concurrently retrieve data from a plurality of light absorbents, spectrally diffracting the light, and detecting the light intensities. By this procedure, it is made possible to prolong the time for playback of one bit and improve the S/N ratio. In a preferred embodiment, the playback time per bit is prolonged to improve the S/N ratio by using an exposure light with a broad wavelength bandwidth of not less than 1 nm to concurrently retrieve an emission containing a plurality of data and detecting the intensity of light by wave-length.

Number of light absorbents

In order to obtain signals with a satisfactory S/N ratio at the playback of the data stored in the recording medium, it is necessary that the statistical fluctuation of the number of light absorbents (the atom, molecule or ion which absorbs) existing in one exposure light spot be decreased to a sufficiently low level. Since the prior art required about $10^7$ absorbents in one light spot as mentioned in the brief description of the prior art, stringent requirements had to be imposed on the material that can be used, thus making it difficult to implement a high-density information recording system.

In the present invention, the number of absorbents that exist in one light spot is reduced to about $10$–$10^5$, which is more or less equal to said multiplicity, so as to prevent overlap of signals from respective absorbents on the wavelength axis. In a preferred embodiment, the number of absorbents per light spot is made substantially equal to multiplicity, i.e. about $10$–$10^5$, so that one absorbent (one molecule of a light absorbent material) is allocated to one data bit. Therefore, in a system where the presence or absence of a signal is assigned to a data bit of 0 or 1, the photon count corresponding to the absence of a signal can be reduced to 0. Therefore, the background at signal detection can be made 0 and its fluctuation can also be made 0, thus offering a great advantage.

Detection of light intensity

Figure 2:
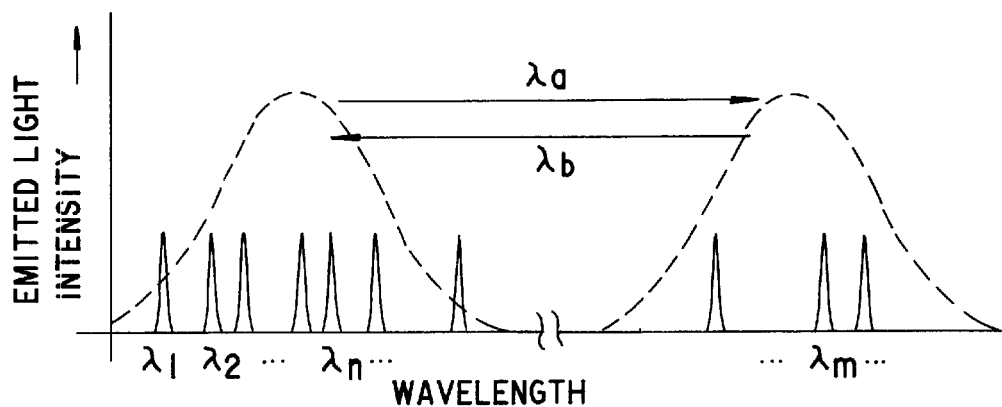
FIG. 2 is a schematic diagram showing the intensity of light emitted from a single light absorbent and the shift of emission wavelength due to irradiation, wherein the dotted curve represents the intensity distribution of the light emitted from a light absorbent.

In accordance with the present invention, the number of light absorbents per light spot has been remarkably decreased and, moreover, the signal from each absorbent is measured not in terms of absorbance but as the intensity of emitted light. The results of such measurement are shown in FIG. 2. In this case, about 10 absorbents exist in a single light spot. When the absorbent which emits a light at $\lambda n$ is exposed to a high-intensity light $\lambda a$, its emission wavelength shifts to $\lambda m$. When, in this state, the same absorbent is exposed to a high-intensity light at $\lambda b$, it returns to the state of emitting light at a wavelength near the initial absorption position.

Recording medium

In accordance with the present invention, the presence or absence of a signal from a single light absorbent corresponds to one information bit, with the result that the fluctuation of the background at signal detection is made 0 to insure a high S/N ratio. By using a material showing the hole-burning phenomenon as the recording medium and condensing the fluorescent light from its light absorbents, the above signal detection can be implemented.

In a preferred embodiment, a material exhibiting the hole-burning phenomenon is used as the recording medium (single light absorbents surrounded in an optically transparent matrix). The material showing the hole-burning phenomenon includes but is not limited to the pentacene molecule surrounded by para-terphenyl, the terrylene molecule surrounded by polyethylene, and the terrylene molecule surrounded by hexadecane.

In another embodiment, air is used as the optically transparent matrix and a substance capable of undergoing a photochemical reaction is used as the light absorbent material. Specifically, an organic dye, such as tetra-tert-butylterrylene surrounded by an organic amorphous matrix such as polyisobutylene can be used as said recording medium. In this case, duplex recording can be implemented by using two kinds of dyes and, similarly, high-multiple recording can be carried out by increasing the number of kinds of dyes.

By vapor-depositing the recording medium on a substrate, a recording medium integrated to the substrate can be fabricated. As the substrate, a variety of inorganic glasses such as quartz glass, silicon, and organic resins can be employed.

Reading light exposure time

Generally an S/N ratio of about 20 is required of an information recording system. The temporal fluctuation (shot noise) of photons released from light absorbents is approximately the square root of photon count. Therefore, in order to obtain an S/N ratio of 20, 400 or more photons must be released. For this purpose, a means is used which sets a reading light exposure time per absorbent to at least 400 times as long as the lifetime (longitudinal relaxation life) of the first-excited state of the light absorbent.

If the reading light exposure time is too much protracted, the reading speed drops and, at the same time, the probability of the absorbent to undergo a photochemical reaction is increased. For this reason, the reading light exposure time is set to not more than 3000 times as long as the lifetime (longitudinal relaxation life) of the first-excited state. By controlling the reading light exposure time within the range of 400-fold to 3000-fold longer than the lifetime of the first-excited state of the light absorbent, the probability of the light absorbent to undergo a photo-chemical reaction can be decreased while satisfying the conditions necessary for obtaining signals with an S/N ratio of not less than 20 and not detracting much from the reading speed.

EFFECTS OF THE INVENTION

In accordance with the optical writing and reading technology of the present invention, a plurality of signals from a single adequately condensed light spot are sorted by wavelength and the intensities of light are detected, whereby the signal from a single light absorbent (the atom, molecule or ion that absorbs light) is efficiently collected and assigned to a digital signal bit of 1 or 0. Therefore, an ultrahigh-density information recording system that permits reading at a high speed and a high S/N ratio can be implemented. As a result, high-density information recording far surpassing that realizable with the conventional recording medium can be realized under practical conditions.

EXAMPLES

Example 1

(i) Preparation of a recording medium

A recording medium comprising a dispersion of pentacene, as a light absorbent material, in paraterphenyl was used. This recording medium is known to exhibit the hole-burning phenomenon at low temperatures. Para-terphenyl, purified by the zone melting method beforehand, was processed into pentacene-doped crystals by the method of Bridgeman. The crystals were milled in an agate mortar, and in a clean furnace, vapor-deposited on the dust-free surface of a quartz glass substrate to provide an integral recording medium-substrate artifact. The vapor deposition could be better controlled by introducing a small amount of argon into the furnace.

(ii) Optical reading method and apparatus

Figure 3:
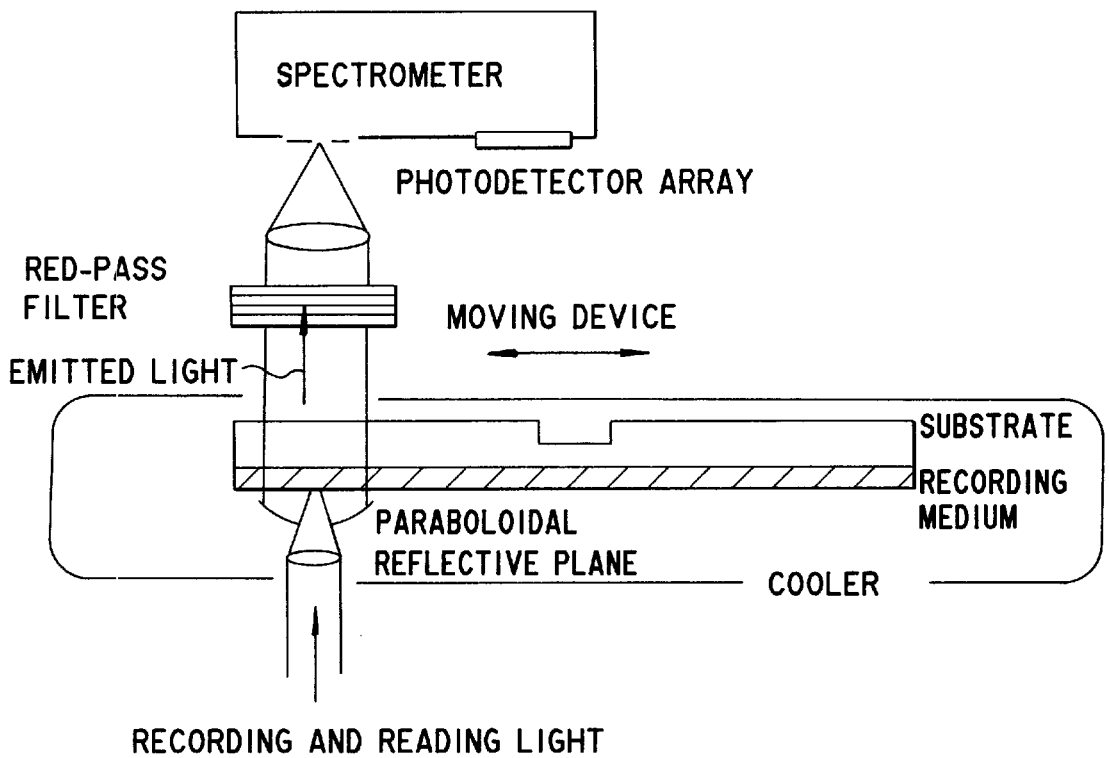
FIG. 3 is a view showing a means for condensing the emission light from a light absorbent by utilizing a reflective paraboloid and a spectral diffraction means in accordance with the present invention.

The integral recording medium-substrate thus prepared was set in a cryostat as illustrated in FIG. 3, chilled to about 2 K (absolute temperature 2 Kelvin), and exposed to laser light (oscillatable wavelength: 570 nm–620 nm) from a Rhodamine 6G dye laser (Coherent Co.). In this procedure, the dominant wavelength used was around 592 nm. To prevent temperal fluctuation of the oscillation wavelength, it was advantageous to introduce a reference light from a wavelength standardizer. This light was condensed by a lens so as to be incident on the recording medium as shown in FIG. 3.

In the current optical memory, the light spot diameter of 1 $\mu$m or less is employed. In contrast, the diameter of the light spot on the recording medium is 2–10 $\mu$m in this example. In this case, the lens can be disposed away from the recording medium and the reflective paraboloid for condensation can be easily interposed between the lens and the recording medium. In addition, the tendency was noted that the use of a spot diameter of this order is rather contributory to the ultimate enhancement of recording density.

Pentacene absorbs at around 592m to undergo a transition to the first-excited state to emit light of a longer wavelength (of lower energy) and is then deactivated. Since the emitted light is released in all directions, the signal light intensity can be increased by returning the light emergent in the direction of incidence as parallel rays in the reverse direction by means of the parabolic reflective surface as illustrated in FIG. 3.

(iii) Detection of light intensity

The reading light condensed in the above manner was passed through a red-pass filter to trim the short wavelength component and, then, spectrally diffracted. Thereafter, using a CCD array (Princeton Instruments) as the photodetector, the light intensity was detected for each wavelength. As a result, signals from single pentacene molecules could be detected as shown in FIG. 2. Thus, the recorded information can be read by relating the presence or absence of emission light of each wavelength to a data bit of 1 or 0.

(iv) Results and Discussion

Since, in this example, the number of light absorbents (pentacene molecules) existing per light spot is approximately equal to 10, the multiplicity is 10. Therefore, the recording density at a light spot diameter of about 2 $\mu$m is 250 Mb/cm$^2$, which is nearly twice the density realizable with the state-of-the art optical recording system.

As the concentration of pentacene molecules is increased, the recording density is also increased but it becomes difficult to discriminate the adjacent wavelengths in reading as well as in writing. Therefore, it is necessary to further lower the temperature and thereby reduce the half bandwidth of each emission. Even by doing so, it has been difficult to obtain a clear discrimination for many molecules over $10^5$. It was, thus, found to be appropriate to control the number of pentacene molecules per light spot within the range of about $10$–$10^5$.

Example 2

(i) Preparation of a recording medium

A recording medium prepared by using terrylene molecules as light absorbents and polyethylene as the matrix was employed. This recording medium was prepared by constructing a gold-containing reflective layer by the sputtering technique on the cleaned surface of a quartz glass substrate and coating a molten terrylene-containing polyethylene resin by the spin-coating technique onto the reflective layer.

(ii) Optical writing and reading method and apparatus

Figure 4:
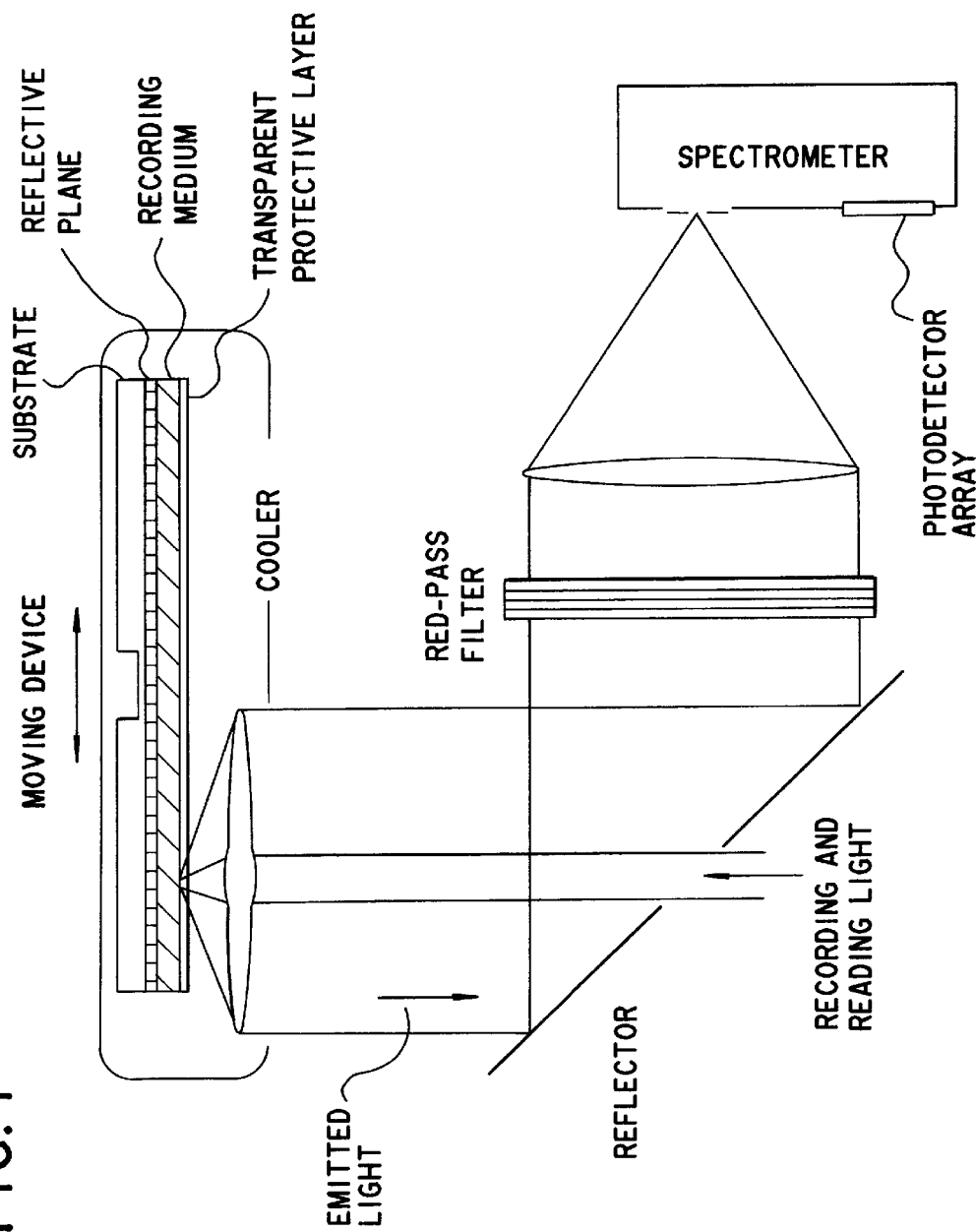
FIG. 4 is a view showing a means for condensing the light emitted from a light absorbent by utilizing a reflective plane and a spectral diffraction means in accordance with the present invention.

In this example, the present invention was carried into practice at a temperature of 2 K using the apparatus illustrated in FIG. 4. Thus, a planar metal reflective layer was deposited by the above process in close contact with a recording medium on the reverse side as viewed from the direction of incidence of reading light so as to totally reflect the emission from the recording medium.

This reflected light was condensed by a lens integral with a reading lens disposed immediately adjacent to the recording medium and the resulting parallel rays were spectrally diffracted by means of a reflective mirror and a red-pass filter and guided to a photodetector array. The above arrangement offers the advantage of simplifying the construction as compared with the arrangement employing a paraboloidal reflector as shown in FIG. 3.

Unlike the case of para-terphenyl as used in Example 1, terrylene is subject to diverse effects owing to the low crystallinity of polyethylene to broaden the width of the absorption spectrum. The recording medium was exposed to a broad-band laser light with a bandwidth of about 1 nm within this broadened absorption band and the reflected light was condensed, spectrally diffracted, and received with a photodetector array for reading the recorded information.

(iii) Results and Discussion

According to this example, data scattered over a broad wavelength range can be read out all at once. Another advantage is that it is no longer necessary to scan a broad wavelength band with laser light. In contrast, when the wavelength band is narrower than 1 nm, laser scanning is necessary, and even if spectrally diffracted and taken in, the number of data that can be taken in at one time is limited. Therefore, it is advantageous to use a reading light with a wavelength bandwidth of not less than 1 nm and, then, spectrally diffract the light.

Example 3

(i) Preparation of a recording medium

A recording medium film was formed on a quartz glass substrate board by the same spin-coating method as described in Example 2 using terrylene molecules as light absorbents as in Example 2 and hexadecane as dispersion matrix.

(ii) Optical writing and reading apparatus

The architecture of the apparatus is substantially identical to that described in Example 2 but is slightly different from the latter in that a transparent protective layer was disposed immediately adjacent to the recording medium on the reading light side as shown in FIG. 4. This transparent protective layer, composed of silicon nitride, was constructed by the reactive magnetron sputtering method. While the refractive index of silicon nitride film varies with different fabrication conditions, the film used in this embodiment had a refractive index of about 2.1 which is greater than that of hexadecane which is about 1.5. The thickness of the silicon nitride film was controlled to tens of nm. In this manner, multiple reflection took place to enhance the efficiency of information reading.

(iii) Results and Discussion

In the case of terrylene molecules, the lifetime (longitudinal relaxation lifetime) of the first excited state is about 4 ns. Therefore, upon transition to the first-excited state, photons are released as fluorescence at a rate of once in 4 ns on the average. Release of photons is not temporally uniform but varies to cause a shot noise. This noise is approximately equivalent to the square root of photon count. Therefore, in order to obtain a signal with an S/N ratio of 20 which is required for information recording, 400 photons have to be released. Therefore, it was necessary to maintain reading light for at least 1.6 $\mu$s.

Furthermore, in the case of this material, when it was irradiated with reading light for 100 $\mu$s, the light absorbent terrylene underwent a photochemical reaction. In order to sufficiently reduce the probability of the event to occur, the reading light exposure time is reduced to about 10 $\mu$s. This is equivalent to reducing the reading light exposure time to at least about 3000 times as long as the lifetime of the first-excited state. This arrangement also serves to prevent slow playback.

Example 4

This example pertains to the case in which information is written and read using a material not showing the hole burning phenomenon. The procedure was carried out in a clean room in order to preclude interference by dust.

(i) Preparation of a recording medium

Two kinds of dyes, namely a water-soluble fluorescein (fluorescein disodium or uranin) (dye A) and fluorescein mercuric acetate (dye B) disodium, were dissolved in distilled water at concentrations of $10^{-9}$ mol/l each. This solution was sprayed in the form of liquid droplets against the cleaned surface of a silicon substrate board and dried in such a manner that one light spot with a diameter of about 5 $\mu$m would contain one molecule each of the two dyes. In this case, the optically transparent matrix surrounding each dye molecule is air.

Incidentally, when a transparent protective layer is disposed on the dye material, the procedure can be performed outside a clean room. As such a transparent protective layer, a UV-cured resin film can be mentioned. Such a protective UV-cured resin film can be formed on a silicon board by the spin-coating technique under conditions not causing dislocation of dye molecules.

(ii) Results and Discussion

The above two kinds of dyes A and B form two absorption bands in the neighborhood of 490 nm. It is known that when dyes A and B are exposed to a high-intensity light around 490 nm, the dyes A and B selectively undergo photochemical reactions according to the wavelength of exposure light so that the absorption bands are lost. Therefore, multiple optical recording can be realized by irradiating the above recording medium with a light having a broad bandwidth at room temperature, condensing the emitted light, spectrally diffracting it, detecting the presence or absence of fluorescence of a specific wavelength, and relating it to a data bit of either 1 or 0. In this embodiment, multiple optical recording could be realized by using two kinds of dyes.

What is claimed is:

1. An optical recording and playback apparatus wherein a light absorbent material surrounded by an optically transparent matrix is used as a recording medium and the presence or absence of flourscent emission light of a specific wavelength from unity of said light absorbent material is utilized for optical writing and reading, which comprises a means for condensing the flourscent emitted light and a means for spectrally diffracting the condensed light, detecting the light intensity by wavelength, and relating the light intensity by wavelength to a record bit.

2. The optical recording and playback apparatus according to claim 1 wherein substances showing the hole burning phenomenon are used as said optically transparent matrix and light absorbent material.

3. The optical recording and playback apparatus according to claim 1 wherein air is used as said optically transparent matrix and a substance capable of undergoing a photochemical reaction as said light absorbent material.

4. The optical recording and playback apparatus according to claim 1 wherein the number of unit light absorbents per light spot is 10–10.

5. The optical recording and playback apparatus according to claim 1 including a means for projecting a reading light with a wavelength bandwidth of not less than 1 nm.

6. The optical recording and playback apparatus according to claim 1 including either a paraboloidal surface or a planar reflective layer disposed adjacent to the recording medium as said means for condensing the emitted light.

7. The optical recording and playback apparatus according to claim 1 wherein the reading light projection time per location of the recording medium is 400–3000 times as long as the lifetime of the first-excited state of the light absorbent material.

8. The optical recording and playback apparatus according to claim 1 including an optically transparent layer having a refractive index different from that of the recording medium and disposed adjacent to said recording medium.

9. An optical recording and playback method wherein a light absorbent material surrounded by an optically transparent matrix is used as a recording medium and the presence or absence of flourscent emission light of a specific wavelength from unity of said light absorbent material is utilized for optical writing and reading, which comprises condensing the flourscent emission in response to reading light, spectrally diffracting the condensed light, detecting the light intensity by wavelength, and relating the light intensity by wavelength to a data bit.

10. The optical recording and playback method according to claim 9 wherein substances showing the hole burning phenomenon are used as said optically transparent matrix and light absorbent material.

11. The optical recording and playback method according to claim 9 wherein air is used as said optically transparent matrix and a substance capable of undergoing a photochemical reaction as said light absorbent material.

12. The optical recording and playback method according to claim 9 wherein the number of unit light absorbents per light spot is $10-10^5$.

13. The optical recording and playback method according to claim 9 which further comprises projecting a reading light with a wavelength bandwidth of not less than 1 nm.

14. The optical recording and playback method according to claim 9 wherein either a paraboloidal surface or a planar reflective layer disposed adjacent to the recording medium as a means for condensing light.

15. The optical recording and playback method according to claim 9 wherein the reading light projection time per location of the recording medium is 400–3000 times as long as the lifetime of the first-excited state of the light absorbent material.

16. The optical recording and playback method according to claim 9 wherein an optically transparent layer having a refractive index different from that of the recording medium is disposed adjacent to said recording medium.

* * * * *